United States Patent
Akamine et al.

(10) Patent No.: US 7,271,662 B2
(45) Date of Patent: Sep. 18, 2007

(54) HIGH FREQUENCY POWER AMPLIFIER CIRCUIT AND ELECTRIC COMPONENT FOR HIGH FREQUENCY POWER AMPLIFIER

(75) Inventors: Hitoshi Akamine, Maebashi (JP); Masahiro Tsuchiya, Tokyo (JP); Kyoichi Takahashi, Fujioka (JP); Kazuhiro Koshio, Komoro (JP)

(73) Assignee: Renesas Technology Corporation, Tokyo (JP)

( * ) Notice: Subject to any disclaimer, the term of this patent is extended or adjusted under 35 U.S.C. 154(b) by 172 days.

(21) Appl. No.: 11/227,109

(22) Filed: Sep. 16, 2005

(65) Prior Publication Data

US 2006/0066398 A1 Mar. 30, 2006

(30) Foreign Application Priority Data

Sep. 24, 2004 (JP) ............................. 2004-276261

(51) Int. Cl.
*H03G 5/16* (2006.01)
*H03F 3/68* (2006.01)
(52) U.S. Cl. ...................................... 330/310; 330/133
(58) Field of Classification Search ................ 330/133, 330/136, 310
See application file for complete search history.

(56) References Cited

U.S. PATENT DOCUMENTS 6,919,762 B2 * 7/2005 Akamine et al. ........... 330/133
6,943,631 B2 * 9/2005 Scherrer et al. ............ 330/310
2006/0139094 A1 * 6/2006 Takahashi et al. .......... 330/133

FOREIGN PATENT DOCUMENTS

| JP | 07-154169 | 6/1995 |
|---|---|---|
| JP | 2000-151310 | 5/2000 |
| JP | 2003-017954 | 1/2003 |

* cited by examiner

*Primary Examiner*—Benny Lee
*Assistant Examiner*—Alan Wong
(74) *Attorney, Agent, or Firm*—Mattingly, Stanger, Malur & Brundidge, P.C.

(57) ABSTRACT

In a high frequency power amplifier circuit in which bias voltages are applied to the transistors for amplification by current mirroring, this invention enables preventing waveform distortion near the peak output power level by allowing sufficient idle currents to flow through the transistors for amplification, while enhancing the power efficiency in a low output power region. The power amplifier includes a detection circuit comprising a transistor for detection which receives the AC component of an input signal to the last-stage transistor for amplification at its control terminal, a current mirror circuit which mirrors current flowing through that transistor, and a current-voltage conversion means which converts current flowing in the slave side of the current mirror circuit into a voltage. In the detection circuit, a voltage from a bias circuit for generating the bias voltages for the transistors for amplification is applied to the control terminal of the transistor for detection and output of the detection circuit is applied to the control terminal of the last-stage transistor for amplification.

10 Claims, 6 Drawing Sheets

HIGH FREQUENCY POWER AMPLIFIER CIRCUIT AND ELECTRIC COMPONENT FOR HIGH FREQUENCY POWER AMPLIFIER

CROSS-REFERENCE TO RELATED APPLICATION

The present application claims priority from Japanese patent application No. 2004-276261 filed on Sep. 24, 2004, the content of which is hereby incorporated by reference into this application.

BACKGROUND OF THE INVENTION

The present invention relates to a technique that is effective for application to a high frequency power amplifier circuit and an electronic component for high frequency power amplification (RF power module) in which the high frequency power amplifier circuit is installed. More particularly, the invention relates to a technique for enhancing the power efficiency of a high frequency power amplifier circuit in which bias application to transistors for amplification is performed by current mirroring.

A high frequency power amplifier circuit (usually consisting of multiple stages) employing semiconductor elements such as MOSFETs (insulated gate type field effect transistors) and GaAs-MESFETs for power amplification is built into a transmitter output section of wireless communication devices (mobile communication devices) such as mobile phones. In the high frequency power amplifier circuit, a bias circuit applies specific bias voltages to the control terminals of the transistors for amplification (the terminals are gate terminals, if the MOSFETs are employed), allowing specific idle currents to flow through the transistors, and in this state, an input high frequency signal is amplified.

Methods of bias application to the control terminals of the transistors for amplification have been proposed. One method is such that an externally supplied control voltage is divided by a resistive divider circuit and the divided voltages are applied (e.g., see patent document 1). Another method is such that a transistor for amplification and a transistor for bias with their gates connected together are provided in each stage of amplification, a bias current is generated by a current mirror circuit comprising a transistor pair which mirrors an externally supplied current at a given ratio, this bias current is allowed to flow through the transistor for bias, and a bias is applied to the transistor for amplification in each stage by current mirroring (e.g., see patent document 2).

A high frequency power amplifier circuit in which bias voltages are applied to the transistors for amplification by current mirroring, as above, keeps constant idle currents flowing through the transistors for amplification respectively even if the characteristics of the transistors for amplification (the threshold voltages of the FETs) vary. Thus, this amplifier circuit does not need correction for variation among the elements and has an advantage that it is manufactured at a high yield. Throughout this application, when a high frequency signal is not input to the amplifier circuit, that is, the amplifier takes no signal, a drain current (collector current in the case of a bipolar transistor) flowing through each transistor for amplification during bias application to the transistors for amplification by current mirroring is called an idle current.

[Patent document 1] Japanese Unexamined Patent Publication No. 2000-151310
[Patent document 2] Japanese Unexamined Patent Publication No. 2003-017954

SUMMARY OF THE INVENTION

In recent mobile phones for a GSM system or the like, a system that is provided with, in addition to a GMSK modulation mode, a mode called Enhanced Data Rates for GSM Evolution (EDGE) which uses $3\pi/8$ rotating 8-Phase Shift Keying (8-PSK) modulation mode which modulates the phase and amplitude components of a carrier and allows for communication switching between these modes is being put into practical use. In one technique (a polar loop scheme) for implementing the EDGE 8-PSK modulation, phase modulation is performed in a stage preceding the power amplifier and amplitude modulation is performed in the power amplifier. In another technique (a Pin control scheme) for implementing that modulation, phase modulation and amplitude modulation are performed in a stage preceding the power amplifier.

In the Pin control scheme, the amplifier output level control is also performed in the stage preceding the power amplifier. When the required output level is high, the amplitude of a signal input to the power amplifier is controlled to be larger. When the required output level is low, the amplitude of a signal input to the power amplifier is controlled to be smaller. In the high frequency power amplifier circuit, constant bias voltages are applied to the transistors for amplification, allowing specific idle currents to flow through the transistors. It is needed to allow relatively large idle currents to flow through the transistors to prevent waveform distortion near a peak output power level (33 dB). In the method of application of constant bias voltages to the transistors for amplification, however, it has been revealed that there is a problem of a decrease in power efficiency in a low region of output power because of the relatively large idle currents.

An invention described in Japanese Unexamined Patent Publication No. Hei 7 (1995)-154169 appears to be based on a technique similar to the present invention. This invention of prior application is such that a detection circuit is provided to detect a high frequency signal that is input to a last-stage transistor for amplification and a voltage as a composition of a detection circuit output and a specific bias voltage is applied to the gate terminal of the last-stage transistor for amplification. However, this operation differs in principle from the present invention in which a voltage equivalent to a bias voltage which is assumed to be applied to the control terminal of the last-stage transistor for amplification is applied to a detection circuit as a bias voltage that gives an operating point at which the detection circuit is actuated and the detection circuit output is applied as is to the control terminal of the transistor for amplification.

The high frequency power amplifier of the above invention of prior application employs a diode, capacitors, and a low pass filter in the detection circuit and a directional coupler to extract an input to the detection circuit. Therefore, when the high frequency power amplifier circuit including the transistors for amplification, bias circuit, and detection circuit is constructed on a single semiconductor chip as a semiconductor integrated circuit, a great number of external parts are required. This poses a problem of difficulty in reducing the size of a module and a wireless communication system (mobile telephone).

It is an object of the present invention to enable preventing waveform distortion near the peak output power level by allowing sufficient idle currents to flow through the transistors for amplification, while enhancing the power efficiency in a low output power region in a high frequency power amplifier circuit in which bias application to the transistors for amplification is performed by current mirroring.

It is another object of the present invention to enable compact and high integration of a semiconductor integrated circuit for high frequency power amplification in which bias application to bipolar transistors for amplification is performed by current mirroring and an electronic component for high frequency power amplification (RF power module) in which the semiconductor integrated circuit for high frequency power amplification is installed.

The above and other objects and novel features of the present invention will become apparent from the description of the specification and the accompanying drawings.

A typical aspect of the invention disclosed herein will be briefly described below.

One aspect of the present invention is embodied in a high frequency power amplifier circuit in which bias application to the transistors for amplification is performed by current mirroring including a detection circuit which comprises a transistor for detection which receives the AC component of an input signal to the last-stage transistor for amplification at its control terminal, a current mirror circuit which mirrors current flowing through that transistor, and a current-voltage conversion means which converts current flowing in the slave side of the current mirror circuit into a voltage. In the detection circuit, a voltage from a bias circuit for generating the bias voltages for the transistors for amplification is applied to the control terminal of the transistor for detection and output of the detection circuit is applied to the control terminal of the last-stage transistor for amplification.

According to this aspect, even if the bias voltages are constant, it is possible to allow an idle current fit for the level of an input high frequency signal to flow through the last-stage transistor for amplification. Thus, by allowing a sufficient idle current to flow through the last-stage transistor for amplification, waveform distortion near the peak output power level can be prevented. On the other hand, in a low output power region, the idle current flowing through the last-stage transistor for amplification can be reduced, so that power efficiency can be enhanced. Because diodes, capacitors, and a low-pass filter are not used, external elements are not necessary, and packaging constituent elements and circuits in a semiconductor integrated circuit is easy.

Advantage to be obtained by a typical aspect of the invention disclosed herein will be briefly described below.

According to the present invention, in a high frequency power amplifier circuit in which biases are applied to the transistors for amplification by current mirroring, it is possible to prevent waveform distortion near the peak output power level by allowing sufficient idle currents to flow through the transistors for amplification and enhance power efficiency in a low output power region.

An advantage according to the present invention is providing the capability to realize compact and high integration of a semiconductor integrated circuit for high frequency power amplifier in which bias application to bipolar transistors for amplification is performed by current mirroring and an electronic component for high frequency power amplification (RF power module) in which the semiconductor integrated circuit for high frequency power amplification is installed.

DETAILED DESCRIPTION OF THE PREFERRED EMBODIMENTS

Preferred embodiments of the present invention will be described in detail hereinafter with reference to the drawings.

First Embodiment

Figure 1:
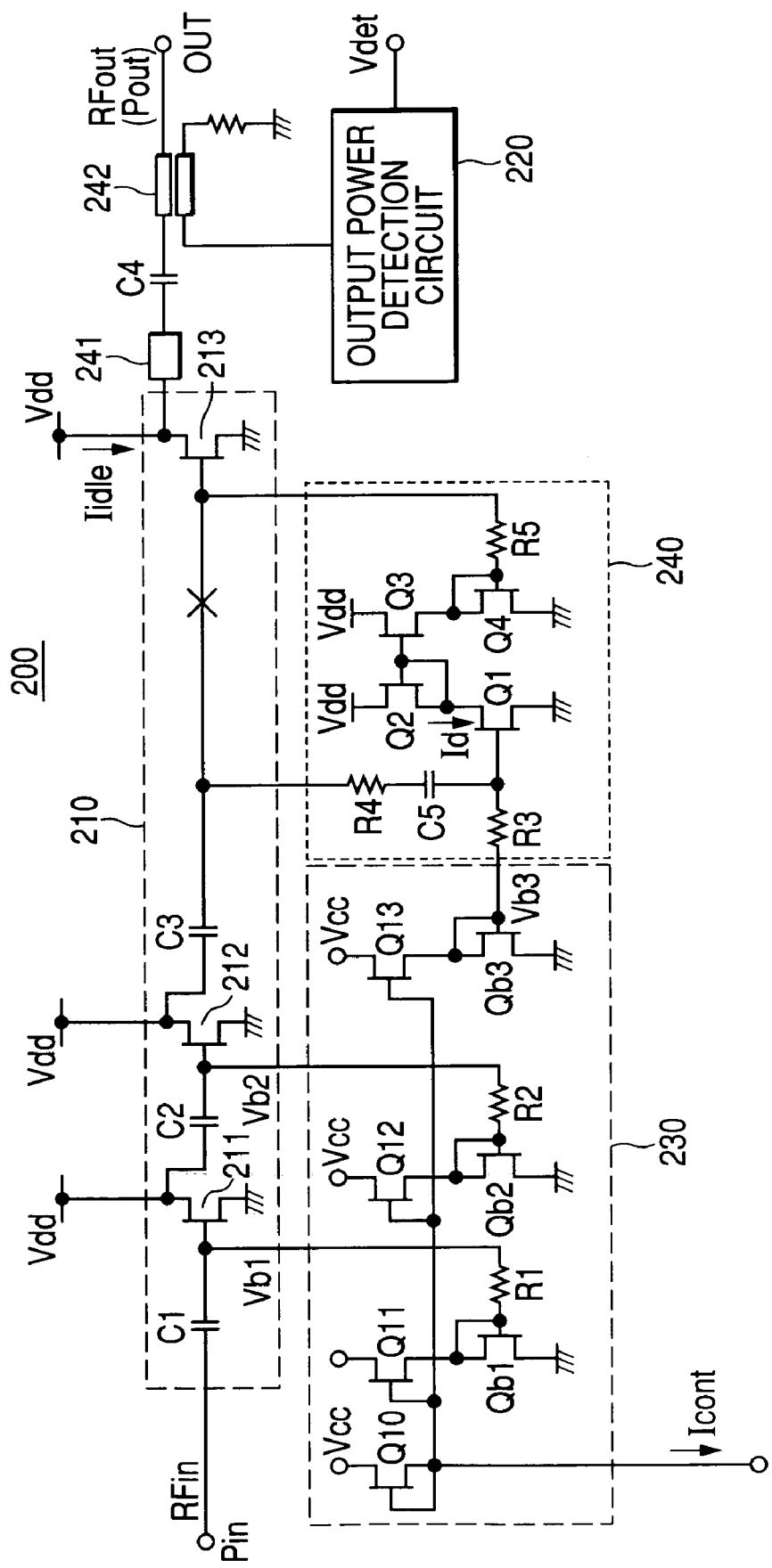
FIG. 1 is a circuit block diagram showing a first embodiment of a high frequency power amplifier circuit according to the present invention.

FIG. 1 shows a first embodiment of a high frequency power amplifier circuit to which the present invention is applied and a high frequency power amplification unit (hereinafter referred to as a power module) in which the above circuit is installed. In this specification, a structure in which a plurality of semiconductor chips and discrete components are installed on an insulating substrate like a ceramic substrate having printed wiring patterns on its surface and inside it and the components are interconnected by the printed wiring and bonding wires to perform their specific functions, wherein the structure is treated like a single electronic component, is called a module.

The power module 200 of this embodiment is comprised of a high frequency power amplifier block 210 including FETs for amplification which amplify an input high frequency signal RFin, an output power detection circuit 220 which detects the output power of the high frequency power amplifier block 210, and a bias circuit 230 which applies bias voltages, respectively, to multiple stages of FETs for amplification of the high frequency power amplifier block 210 and controls idle currents flowing through the FETs.

The high frequency power amplifier block 210 of this embodiment is equipped with, but not limited to, three FETs 211, 212, 213 for power amplification, wherein the gate terminals of later two stages of FETs 212, 213 are connected to the drain terminals of their preceding FETs 211, 212, respectively. It is thus configured as an amplifier circuit consisting of a total of three stages. A supply voltage Vdd is applied to the drain terminals of all stages of FETs, 211, 212, 213. A DC cut capacitor element C1 is provided between the gate terminal of the first-stage FET 211 and an input terminal Pin and a high frequency signal RFin is input via the capacitor element to the gate terminal of the FET 211.

A DC cut capacitor element C2 is connected between the drain terminal the first-stage FET 211 and the gate terminal of the second-stage FET 212. A DC cut capacitor element C3 is connected between the drain terminal of the second-stage FET 212 and the gate terminal of the last-stage FET 213. The drain terminal of the last-stage FET 213 is connected via an impedance matching circuit 241, a capacitor element C4, and a coupler 242 to an output terminal OUT from which a signal RFout in which the high frequency input signal RFin DC component has been cut and AC component amplified is output.

Gate bias voltages Vb1, Vb2, Vb3 supplied from the bias circuit 230 are applied, respectively, to the gate terminals of all stages of FETs 211, 212, 213, so that idle currents corresponding to these voltages flow through the FETs 211, 212, 213, respectively.

The bias circuit 230 is comprised of a diode-connected MOS transistor Q10 which converts an externally supplied constant current Icont into a voltage, MOS transistors Q11, Q12, Q13, each of which and the transistor Q10 form a current mirror circuit with their gates connected to a common line, and diode-connected MOS transistors Qb1, Qb2, Qb3 connected in series to the transistors Q11, Q12, Q13, respectively. Currents mirrored to the transistors Q11, Q12, Q13 are converted into voltages by the transistors Qb1, Qb2, Qb3, respectively, and these voltages are fed as bias voltages via resistors R1, R2, R3, respectively, to the gate terminals of the FETs 211, 212, 213 for amplification.

The sizes of the MOS transistors Q10 and Q11, Q12, Q13 are proportionally set for a given ratio to be fit for the FETs 211-213 for amplification, respectively, and thereby idle currents in proportion to the externally supplied constant current Icont are allowed to flow through the FETs 211-213. The resistors R1-R3 work to inhibit the currents flowing into the transistors Qb1, Qb2, Qb3 for bias from changing due to high frequency signal leakage from the input terminal.

In the high frequency power amplifier circuit of this embodiment, a detection circuit 240 is provided between the gate terminal of the third-stage MOS transistor Qb3 for bias in the bias circuit 230 and the gate terminal of the last-stage FET 213 for amplification. The detection circuit 240 detects a high frequency signal to be input to the gate terminal of the FET 213 from the preceding-stage FET 212, generates a voltage corresponding to the detected signal level plus the voltage as a result of the conversion by the transistor Qb3 for bias, applies the generated voltage to the gate terminal of the FET 213 for amplification, and increases the idle current.

The detection circuit 240 is comprised of a MOS transistor Q1 for detection whose gate terminal is connected via a resistor R4 and a capacitor C5 which are inserted in series to an intermediate point on a signal line connecting the drain terminal of the second-stage FET 212 for amplification and the gate terminal of the FET 213 for amplification, a P-channel MOS transistor Q2 connected in series to the transistor Q1, a MOS transistor Q3 connected to the transistor Q2 in a current mirror fashion, and a MOS transistor Q4 for current-voltage conversion connected in series t the transistor Q3. The resistor R4 preferably has a resistance value on the order of a few kΩ and the capacitor C5 preferably has a capacitance value on the order of 10 pF. Although the resistor R4 and the capacitor C5 may be external elements, such elements formed on a same semiconductor chip on which the transistors Q1-Q4 constituting the detection circuit 240 are installed can be used.

The detection circuit 240 of this embodiment is configured such that the voltage as a result of the conversion by the transistor Qb3 in the bias circuit 230 is fed to the gate terminal of the MOS transistor Q1 for detection via the resistor R3 as a bias voltage that gives an operating point and causes the operating current to flow. The gate bias voltage of the MOS transistor Q1 for detection is set at a voltage value near a threshold voltage of the Q1 to enable the transistor Q1 to perform class "B" amplification. Thereby, a current that is proportional to an AC signal input via the capacitor C5 to the transistor Q1 and like a result of half-wave rectification of the AC signal flows through the MOS transistor Q1 and, in consequence, the drain current of the Q1 includes a DC component in proportion to the amplitude of the input AC signal.

The drain current Id of this transistor Q1 is mirrored to the Q3 by the current mirror circuit consisting of the Q2 and Q3 and converted into a voltage by the diode-connected transistor Q4. This voltage is applied to the gate terminal of the last-stage FET 213 for amplification and an idle current Iidle corresponding to the voltage applied to the gate terminal flows. Thus, as the amplitude of the input high frequency signal RFin increases, the detection circuit 240 output voltage rises, and, accordingly, the idle current flowing through the FET 213 for amplification increases. In short, the idle current in proportion to the amplitude of the input high frequency signal RFin is allowed to flow through the FET 213 for amplification.

Consequently, when the high frequency power amplifier circuit of this embodiment is applied, by setting the bias current flowing through the transistor Qb3 for bias smaller than the corresponding current when the detection circuit 240 otherwise would be dispensed with, the power efficiency can be enhanced during low output with a smaller amplitude of the input high frequency signal RFin, whereas, during high output with a larger amplitude of the input high frequency signal RFin, desired output power is gained by allowing a large idle current to flow and waveform distortion can be reduced.

Figure 2:
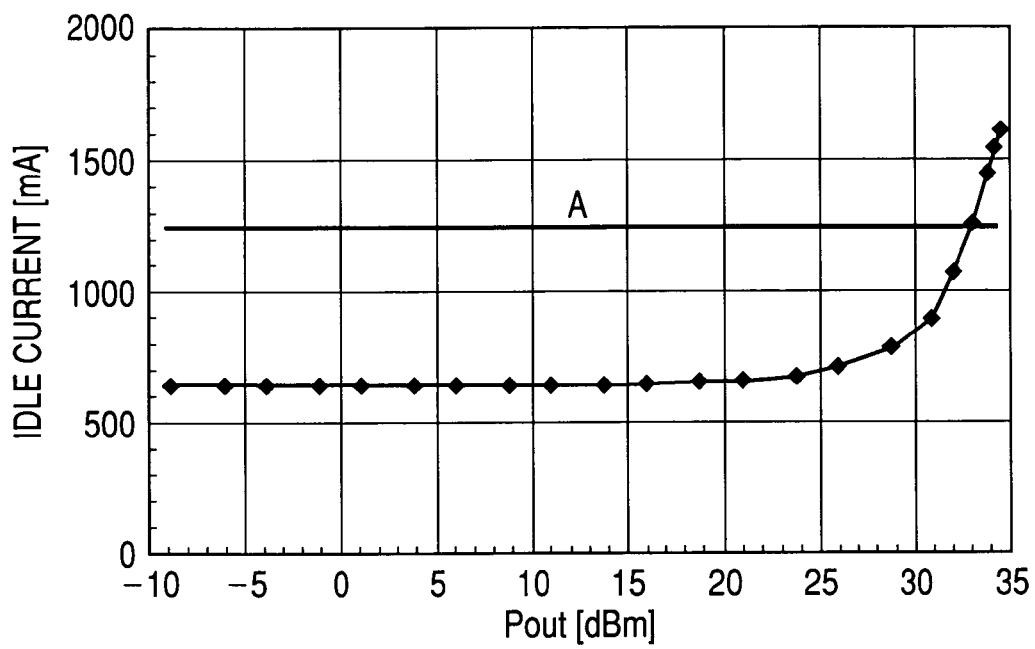
FIG. 2 is a characteristic graph showing relationships between output power Pout and an idle current Iidle flowing through a last-stage FET for amplification when a high frequency power amplifier circuit of an embodiment of the invention is applied and when a detection circuit in the embodiment is dispensed with and a voltage as a result of conversion by a transistor for bias is directly applied to the gate terminal of the FET for amplification.
Figure 3:
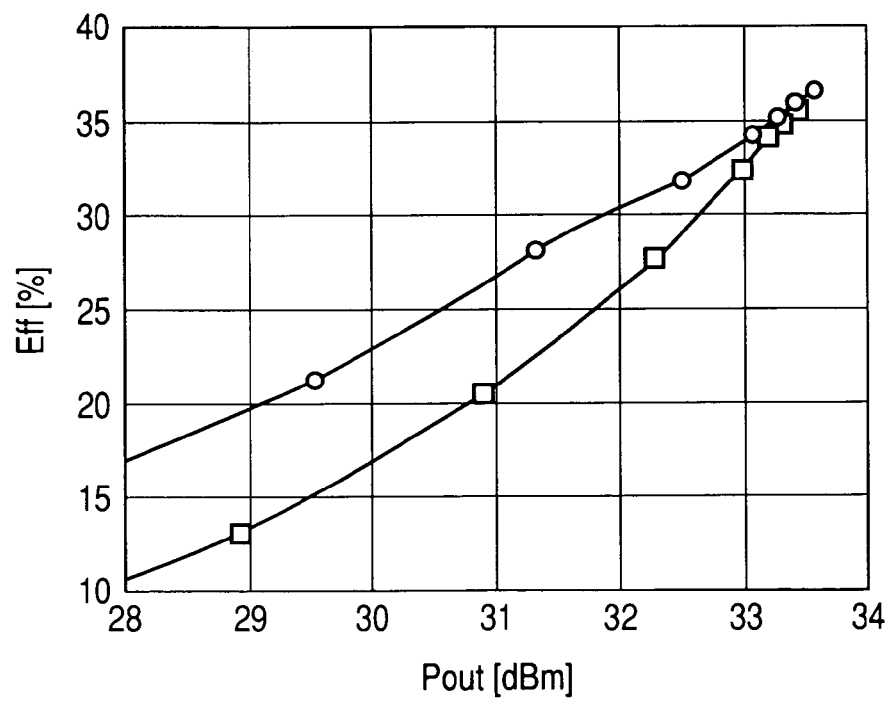
FIG. 3 is a characteristic graph showing relationships between output power Pout and power efficiency Eff when the high frequency power amplifier circuit of the embodiment of the invention is applied and when the detection circuit in the embodiment is dispensed with and the voltage as a result of the conversion by the transistor for bias is directly applied to the gate terminal of the FET for amplification.

FIG. 2 shows relationships between output power Pout and the idle current Iidle flowing through the last-stage FET 213 for amplification without the input of a high frequency signal RFin when the high frequency power amplification unit 200 of the present invention is applied, wherein it is assumed that the input high frequency signal RFin has an effect on only the output power detection circuit 220, but does not have an effect on the FET 213 for amplification (if the RFin line is cut at a mark X in FIG. 1) and when the detection circuit 240 in the embodiment is dispensed with and the voltage as a result of the conversion by the transistor Qb3 for bias is directly applied to the gate terminal of the FET 213 for amplification. FIG. 3 shows relationships between output power Pout and power efficiency Eff in the same situations.

In FIG. 2, a diamond dotted curve plots the relationship between output power Pout and the idle current Iidle flowing through the last-stage FET when the high frequency power amplification unit 200 of the present invention is applied. As a solid line A as shown in the figure, the idle current Iidle flowing through the last-stage FET in a conventional-type high frequency power amplifier circuit without the detection circuit 240 is set generally constant, not dependent of the output power Pout, so that the idle current required at nearly full power (in the vicinity of 33 dBm) will flow.

In FIG. 3, a circle dotted curve plots the relationship between output power Pout and power efficiency Eff when the high frequency power amplification unit 200 of the present invention is applied. A square dotted curve plots the relationship between output power Pout and power efficiency Eff when a similar circuit without the detection circuit 240 is used. From FIG. 2 and FIG. 3, it is apparent that the idle current is decreased in a low region of output power Pout level (less than 33 dBm) and the power efficiency can be enhanced by the application of the present embodiment, as compared with the case where the embodiment is not applied.

In this embodiment, the sizes of the MOS transistors Q1 and Q4 are set for a given ratio and the sizes of the MOS transistors Q2 and Q3 are set for a given ratio. Thereby, when the characteristics (particularly, threshold voltages) of the MOS transistors Q1 and Q2 vary due to, for example, manufacturing variance or change, affected by change in ambient temperature, the characteristics of the MOS transistors Q4 and Q3 mating these transistors in pairs also change. As a result, the effects of variation in the characteristics offset each other and a voltage that has been detected, unaffected by variation in the MOS transistors, appears at the drain terminal of the MOS transistor Q4.

Likewise, since the sizes of the MOS transistor Qb3 and the FET 213 for amplification are set for a given ratio, when the characteristics of the MOS transistor Qb3 vary or change, affected by change in ambient temperature, the characteristics of the FET 213 for amplification also change. Thus, a desired idle current in accordance with the ratio of the sizes is allowed to flow through the FET 213 for amplification.

The power module 200 of this embodiment is configured such that the elements in the power amplifier block 210 (except the DC cut capacitor elements C1-C3) and the elements in the output power detection circuit 220, the bias circuit 230, and the detection circuit 240 are packaged as a semiconductor integrated circuit on a single semiconductor chip such as monocrystalline silicon. This semiconductor integrated circuit and the capacitor elements C1-C3 in the power amplifier block 210, the impedance matching circuit 241, the DC cut capacitor element C4, and the coupler 242 are installed on a single ceramic substrate and constitute the power module. Inductors that constitute the impedance matching circuit 241 can be formed by bonding wires connected between the pads on the semiconductor chips or by micro-strip lines formed on the module substrate.

In this way, in the power module of the present embodiment, because the power amplifier block 210, the output power detection circuit 220, the bias circuit 230, and the detection circuit 240 are formed as the semiconductor integrated circuit on the single semiconductor chip, the module size can be reduced with a smaller number of the components. Moreover, the semiconductor integrated circuit IC1 of this embodiment can be equipped with an error amplifier, not shown, which compares a voltage detected Vdt by the output power detection circuit 220 and an output level signal Vramp from the baseband circuit and generates a control signal Vramp corresponding to a potential difference. The control signal Vramp generated by the error amplifier is supplied to the bias circuit 230 to cause the bias circuit 230 to generate bias voltages Vb1-Vb3 to be fed to the high frequency power amplifier block 210.

Since the high frequency power amplifier circuit of this embodiment shown in FIG. 1 has no power control terminal, wherein biases are fixed, this is effective for use in a system where output power is controlled in a manner that biases are fixed and input is variable, for example, by changing the amplitude of a high frequency signal RFin to be input to the gate terminal of the FET for amplification 211 in accordance with the output control voltage at a stage prior to the input terminal Pin. Such system is typically a mobile phone allowing for, e.g., Enhanced Data Rates for GSM Evolution (EDGE) or Wide-band Code Division Multiple Access (WCDMA) communication.

Figure 4:
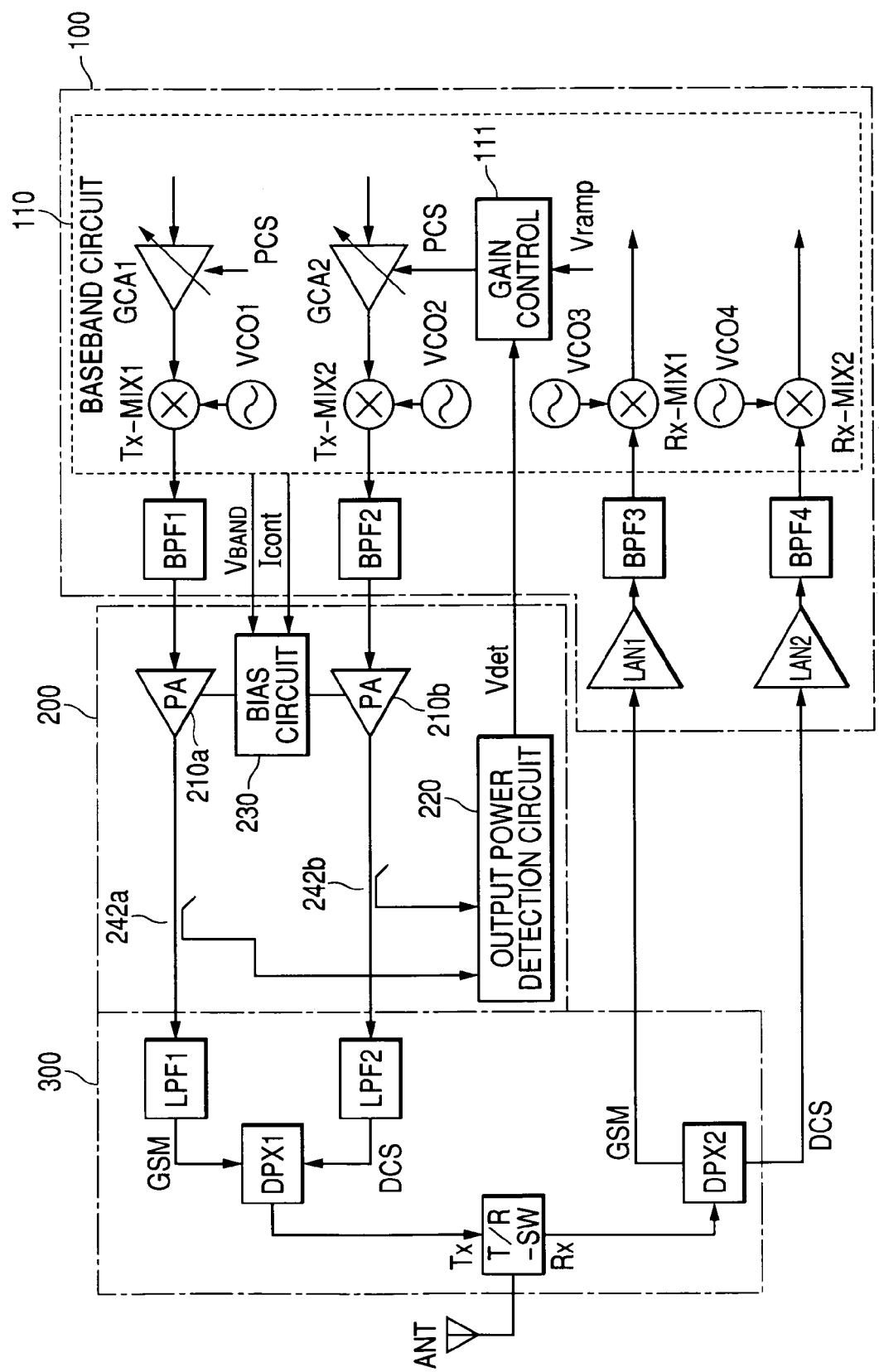
FIG. 4 is a block diagram showing a schematic of an example of a wireless communication system in which the high frequency power amplifier circuit (power module) of the first embodiment is favorably applied.

FIG. 4 shows a schematic of a system allowing for two modes of wireless communication, GSM and DCS, as an example of a wireless communication system in which the power module of the foregoing embodiment is effectively applied.

In FIG. 4, reference "ANT" denotes an antenna for transmitting and receiving radio signal carriers. Reference numeral 100 denotes an electronic device (hereinafter referred to as an RF device) in which the following components are installed in a package: a high frequency signal processing circuit (hereinafter referred to as a baseband IC) 110, which is a semiconductor integrated circuit, including modulators and demodulators which can perform GMSK modulation/demodulation and PSK modulation/demodulation in EDGE mode in the GSM and DCS systems and circuits for generating I and Q signals, based on transmission data (baseband signals), and processing I and Q signals extracted from received signals, low noise amplifiers LNA1, LNA2 which amplify received signals, band-pass filters BPF1, BPF2 which remove harmonic components from transmit signals, band-pass filters BPF3, BPF4 which removes unwanted noise from received signals, etc. The low noise amplifiers LNA1, LNA2 can be built into the baseband IC 110.

The baseband IC 110 is provided with mixers Tx-MIX1, Tx-MIX2 which up-convert transmit signals for GSM and DCS respectively, mixers Rx-MIX1, RxMIX2 which down-convert received signals for GSM and DCS respectively, oscillators VCO1-VCO4 which generate oscillation signals to be mixed with transmit signals and received signals by these mixers, gain control amplifiers GCA1, GCA2 which amplify transmit signals for GSM and DCS respectively, and a gain control circuit 111 which controls the gains of these amplifiers to output signals with a desired amplitude.

In FIG. 4, reference numeral 200 denotes the power module of the foregoing embodiment which amplifies high frequency transmit signals supplied from the baseband IC 110. Reference numeral 300 denotes a front-end module including filters LPF1, LPF2 for removing noise such as harmonics from transmit signals, duplexers DPX1, DPX2 for duplexing and separating GSM and DCS signals, and a transmit/receive changeover switch T/R-SW. The power module 200 is provided with a high frequency power amplifier circuit 210a for GSM and a high frequency power amplifier circuit 210b for DCS.

In this embodiment, as shown in FIG. 4, from the baseband IC 110, a mode select signal VBAND indicating which mode GSM or DCS applies and a constant current Icont are fed to the bias circuit 230 for the high frequency power amplifier circuits (hereinafter referred to as power amplifiers) 210a, 210b. Based on the control signal VBAND and constant current Icont, the bias circuit 230 generates bias currents and supplies them to either the power amplifier 210a or 210b. The bias circuit 230 is provided with the current mirror circuits of transistors Q10-Q13, transistors Qb1-Qb3 for bias, and detection circuits 240 respectively for GSM and DCS and an additional selection circuit or the like.

In this embodiment, a detected voltage Vdet output by the output power detection circuit 220 in the power module 200 is fed to the gain control circuit 111 in the baseband IC 110. The gain control circuit 111 compares the output detected voltage Vdet with an output level signal Vramp generated within the baseband, generates a power control signal PCS to the gain control amplifiers GCA1, GCA2, and controls the gains of these amplifiers. Accordingly, the amplitude of a high frequency signal to be input to the power amplifiers 210a, 210b is controlled.

Embodiment 2

Figure 5:
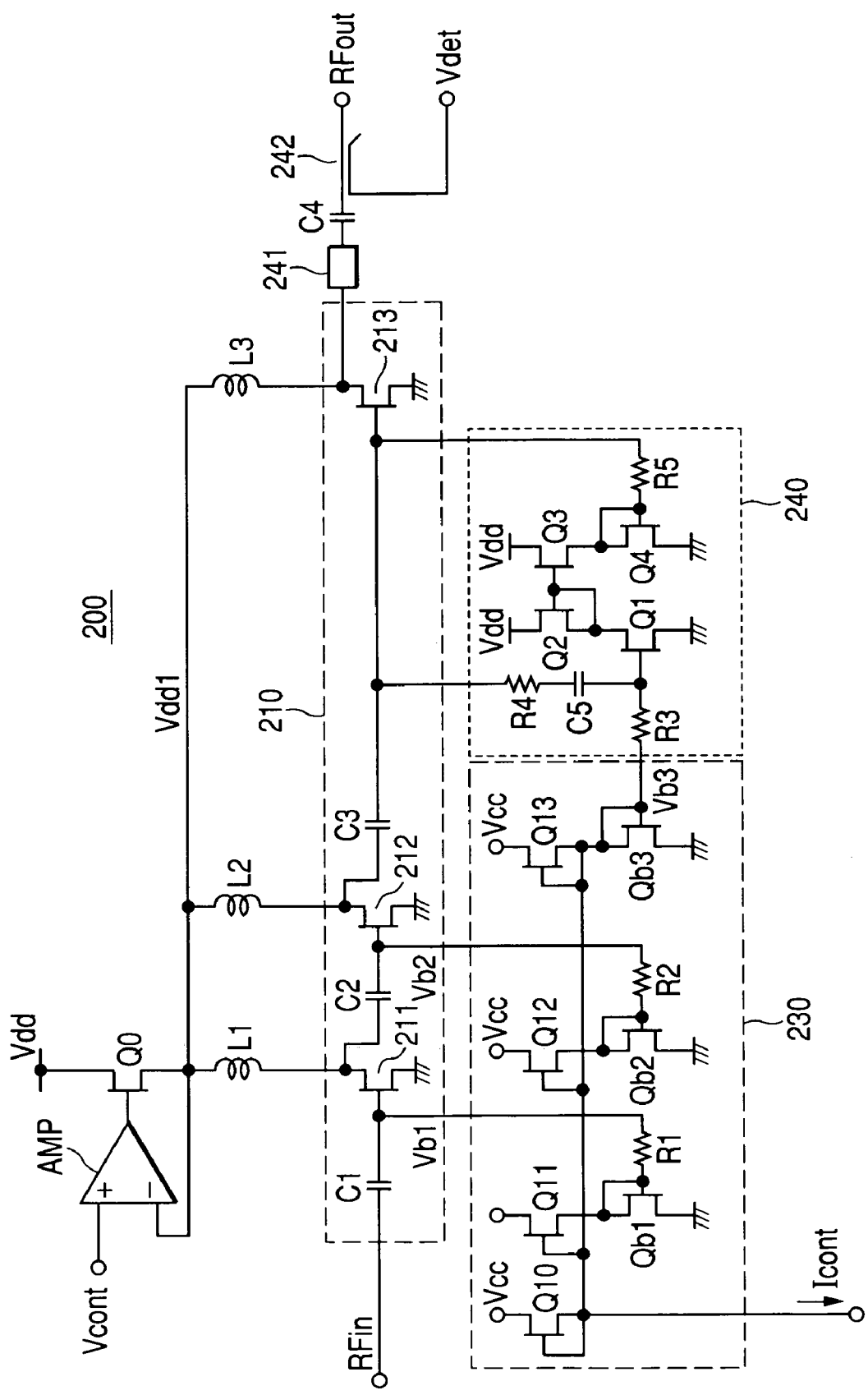
FIG. 5 is a circuit block diagram showing a second embodiment of a high frequency power amplifier circuit according to the present invention.

FIG. 5 shows a second embodiment of a high frequency power amplifier circuit to which the present invention is applied and a power module in which the above circuit is installed. This embodiment is applied to a high frequency power amplifier circuit using an output power control method in which a drain voltage Vdd1 is controlled, while the gate biases of the transistors 211-213 for amplification are fixed. The amplitude of an input high frequency signal RFin is set constant.

As shown in FIG. 5, in this embodiment, inductors L1-L3 respectively connected to the drain terminals of the transistors 211-213 for amplification and a MOS transistor Q0 connected between the inductors L1-L3 and a supply voltage terminal Vdd, a differential amplifier AP which controls the gate voltage of the MOS transistor Q0 are provided. For the transistor Q0, a relatively large MOS transistor allowing for a relatively large current to flow is used. The differential amplifier AMP in which a control voltage Vcont is applied to its noninverting input terminal and the drain voltage of the Q0 is fed back to its inverting input terminal works to match the drain voltage of the MOS transistor Q0 to the control voltage Vcont.

As is the case for the first embodiment, the detection circuit 240 is provided between the drain terminal of the second-stage transistor 212 for amplification and the gate terminal of the last-stage transistor 213 for amplification. The detection circuit 240 detects a high frequency signal, generates a voltage as the addition of a voltage corresponding to the amplitude of the detected to the voltage as a result of the conversion by the transistor Qb3 for bias, and applies the generated voltage to the gate terminal of the last-stage transistor 213 for amplification. In this embodiment, according to the control voltage Vcont supplied externally, the differential amplifier AMP changes the drain voltages of the FETs 211-213 for amplification. Accordingly, the bias currents to the FETs 211-213 for amplification are controlled.

Specifically, when the drain voltages of the transistors 211-213 for amplification are increased by the control voltage Vcont, the amplitude of a high frequency signal that is output from the drain terminal of the second-stage transistor 212 for amplification increases. When this signal with the increased amplitude is detected by the detection circuit 240, the gate voltage of the last-stage transistor 213 for amplification is set higher than when only the voltage from the transistor Qb3 for bias provides the gate voltage and the idle current Iidle increases. Thus, by setting the bias current flowing through the transistor Qb3 for bias smaller than the corresponding current when the detection circuit 240 otherwise would be dispensed with, the power efficiency can be enhanced during low output with a smaller amplitude of the input high frequency signal RFin. In this embodiment, because control of the idle current Iidle flowing through the last-stage transistor is also controlled by the control voltage Vcont, the efficiency can be enhanced by decreasing the idle current Iidle in the low output power region to more exactly than in the first embodiment (FIG. 1).

Figure 6:
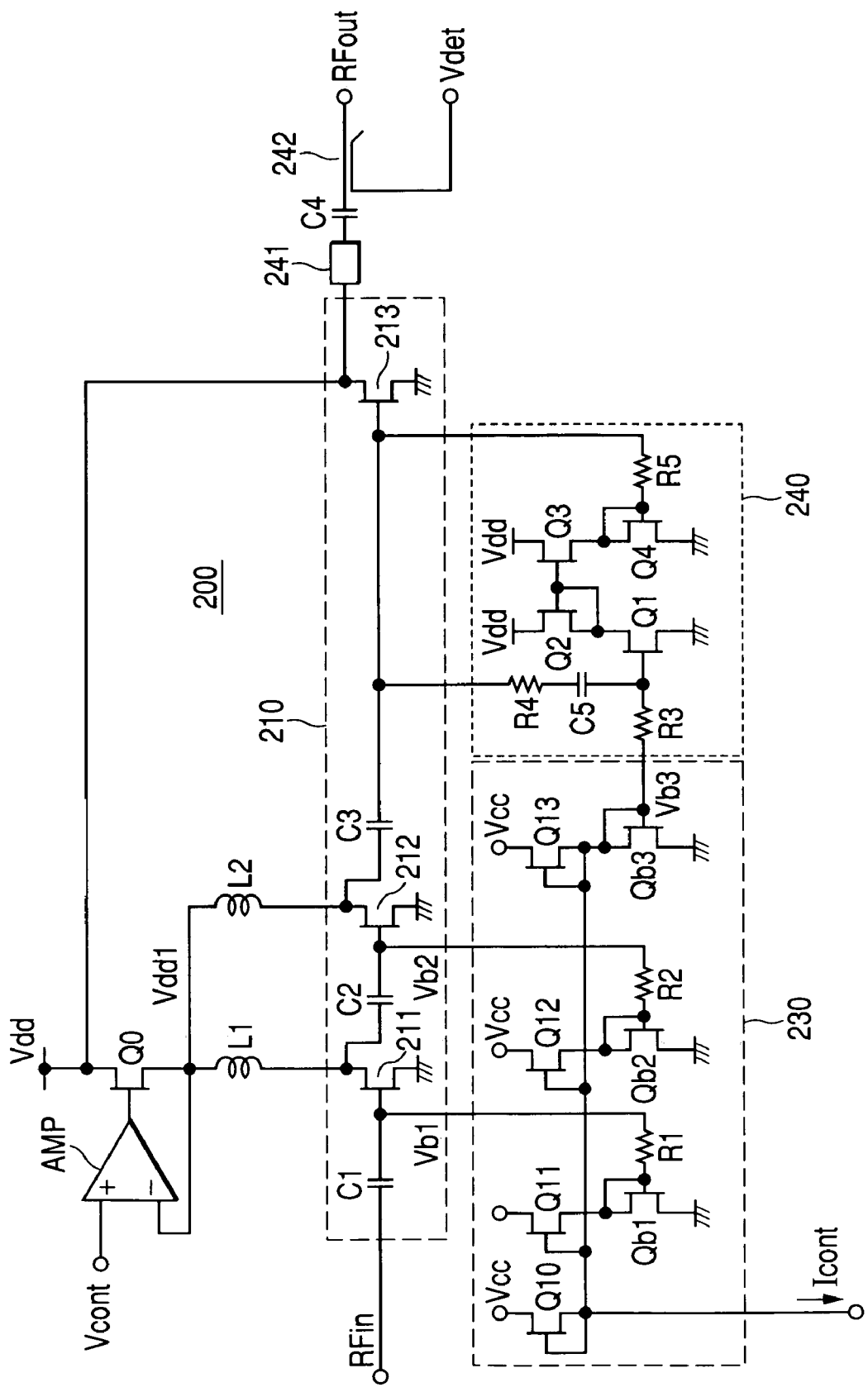
FIG. 6 is a circuit bock diagram showing an example of a modification to the high frequency power amplifier circuit of the second embodiment.

FIG. 6 shows an example of a modification to the high frequency power amplifier circuit of the second embodiment shown in FIG. 5. In this modification example, the MOS transistor Q0 is connected between the supply voltage terminal Vdd and inductors L1, L2 connected to the drain terminals of the first-stage and second-stage transistors 211 and 212 among the transistors 211-213 for amplification. The drain terminal of the last-stage transistor 213 for amplification is connected to the supply voltage terminal Vdd without the intervention of the MOS transistor Q0. Other details are the same as in the second embodiment structure of FIG. 5. The high frequency power amplifier circuit of FIG. 6 can enlarge the range of change of the idle current Iidle than when the detection circuit 240 is dispensed with, though the range of change of the idle current Iidle flowing through the last-stage transistor 213 for amplification is reduced as compared with the high frequency power amplifier circuit of the second embodiment shown in FIG. 5.

Figure 7:
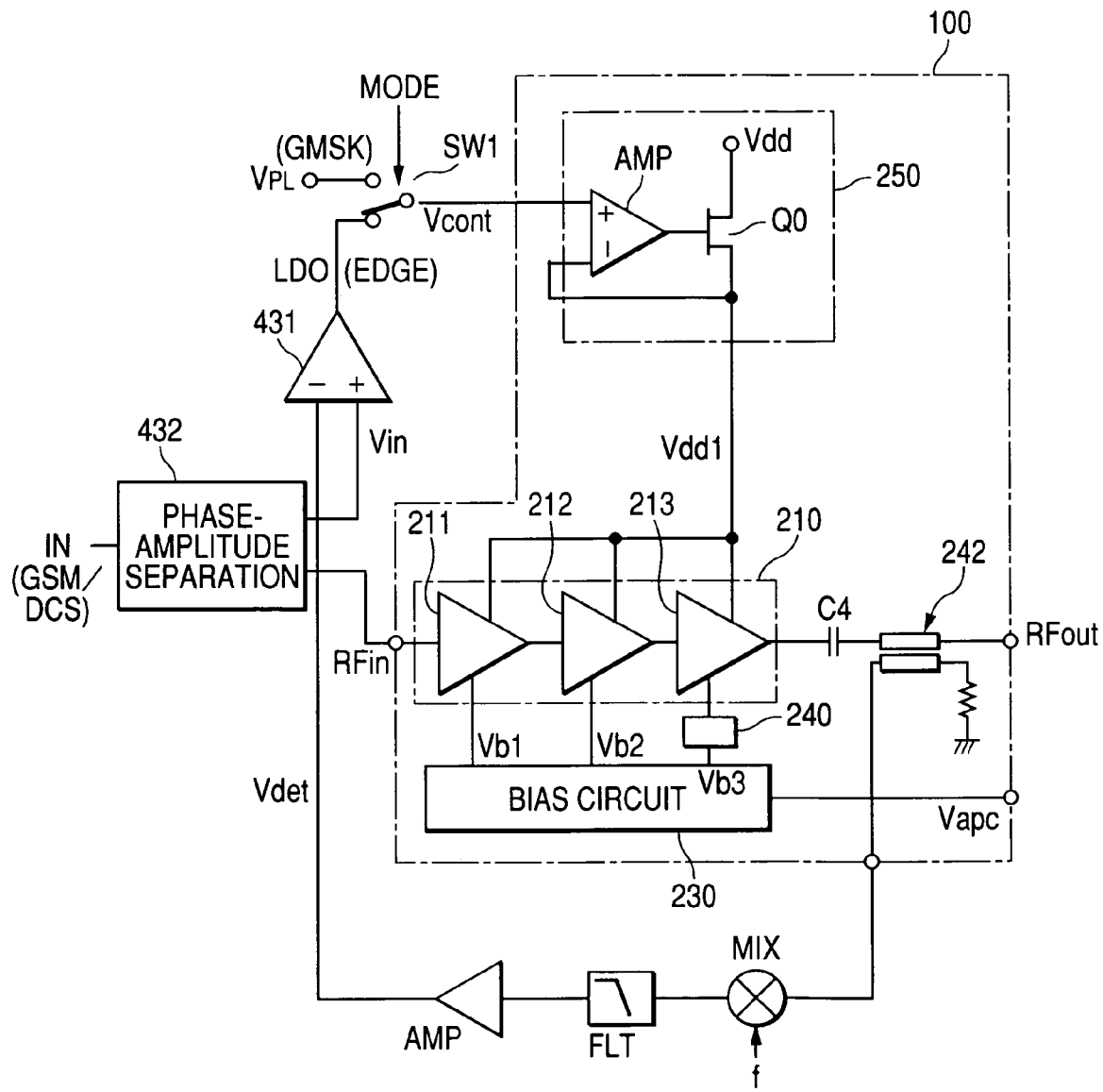
FIG. 7 is a block diagram showing a schematic of an example of a wireless communication system in which the high frequency power amplifier circuit (power module) of the second embodiment is favorably applied.

FIG. 7 a preferable configuration example of a wireless communication system in which the power module of the embodiment of FIG. 5 or FIG. 6 is applied, incorporating the EDGE mode in which the PSK modulation is performed. In FIG. 7, elements and circuits corresponding to those shown in FIG. 5 or FIG. 6 are assigned the same reference numerals and symbols and their explanation is not repeated. In FIG. 7, either the amplifier chain for amplifying signals for GSM or the amplifier chain for amplifying signals for CDS is only shown and the other is not shown.

In the embodiment of FIG. 7, a changeover switch SW1 is provided to select the output LD0 of the error amplifier 431 during the mode in which the PSK modulation is performed (hereinafter referred to as EDGE mode) and select an output level signal VPL that is supplied from the baseband circuit during the mode in which the GMSK modulation is performed (hereinafter referred to as GSM mode) as the above output control signal Vcont that is fed to the differential amplifier AMP in a power supply circuit. Switching of this changeover switch SW1 is controlled by a mode signal MODE that is supplied from the baseband circuit. This switch SW1 may be provided in a modulator/demodulator circuit (IC for modulation/demodulation) which has functions to modulate transmit signals and demodulate received signals. The baseband circuit generates an output level signal VPL corresponding to an output level that is determined, according to, for example, a distance between the wireless system (mobile phone) and a base station, or the intensity of radio waves the system receives.

The error amplifier 431 is configured to compare an amplitude signal Vin from a phase-amplitude separation circuit 432 which separates a transmit signal IN into a phase signal RFin and an amplitude signal Vin with a detected voltage signal Vdet from a coupler 242 located at the output of the high frequency power amplifier circuit 210 and output a signal corresponding to a potential difference. Thereby, feedback control is performed to match the output level of the high frequency power amplifier circuit 210 to the level of the amplitude signal Vin.

An AC signal extracted by the coupler 242 is frequency converted (down-converted) by a mixer MIX and fed via a filter FLT and an amplifier AMP to the error amplifier 431 as the detected voltage signal Vdet. The phase-amplitude separation circuit 432 is provided in the IC for modulation/demodulation having the functions to modulate transmit signals and demodulate received signals.

While the invention made by the present inventors has been described specifically, based on its preferred embodiments, it will be appreciated that the present invention is not limited to the illustrative embodiments described hereinbefore and may be embodied in other modified forms without departing from its spirit or essential characteristics. For example, in the foregoing embodiments, the AC component of a high frequency signal input to the FET 213 for amplification is extracted at an intermediate point on the signal line between the DC cut capacitor C3 and the gate terminal of the FET 213 and input to the detection circuit 240. However, it may be extracted at an intermediate point on the signal line between the drain terminal of the preceding-stage FET 212 for amplification and the capacitor C3.

While, in the foregoing embodiments, the detection circuit is used to detect the amplitude level of a high frequency signal input to the FET 213 for amplification, a nonlinear amplifier circuit that nonlinearly amplifies an AC signal input, taking the voltage (Vb) given to it as the operating point, and outputs the thus amplified voltage of the AC signal may be used for this purpose, not limited to the detection circuit as provided in the embodiments. While the transistors Q1-Q4 constituting the detection circuit 240 are formed, together with the FETs 211-213 for amplification, on the same semiconductor chip, these transistors may be external elements that are formed separately if having the same temperature characteristics, While, in the foregoing embodiments, the FETs are used as the transistors 211-213 for amplification, other transistors such as bipolar transistors, GaAs MESFETs, Heterojunction Bipolar Transistors (HBT), and High Electron Mobility Transistors (HEMTs) can be used as the transistors 211-213 for amplification. While, in the foregoing embodiments, the high frequency power amplifier block comprising three stages of amplifiers has been described, the present invention can be applied to the corresponding block comprising two stages of amplifiers. A resistor element may be used instead of the transistor Q4 for current-voltage conversion as a component of the detection circuit 240.

In the foregoing embodiments, systems where the high frequency power amplifier circuit operates, controlled in a manner that biases are fixed and input is variable, have been described. However, the high frequency power amplifier circuit disclosed with its embodiments can be applied in a system where that circuit operates, controlled by changing the biases with input fixed.

The invention made by the present inventors has been described on the assumption that it is applied to a power module built into a wireless communication system allowing for EDGE mode transmission and reception, involving the PSK modulation mode, in the background field where the invention will be utilized. However, the present invention is not so limited and can be utilized as a power module built into a wireless communication system such as a mobile phone and a wireless LAN using a communication scheme such as Code Division Multiple Access (CDMA) in which the gain of the high frequency power amplifier circuit is fixed and the amplitude of a transmit signal is controlled in accordance with the output level at a stage prior to that circuit.

What is claimed is:

1. A semiconductor integrated circuit for high frequency power amplifier comprising:

a power amplifier circuit including two or more transistors for amplification connected in cascade to amplify a high frequency signal to be transmit;

a detection circuit which detects an input signal to a last-stage transistor of the power amplifier circuit, generates a voltage corresponding to the amplitude of the input signal, and supplies the voltage to a control terminal of the last-stage transistor; and a bias circuit which generates bias voltages to set desired idle currents to flow through the transistors for amplification respectively, wherein the last-stage transistor and elements constituting the detection circuit are formed on a same semiconductor substrate, and the detection circuit receives the bias voltage which is given to the last-stage transistor and an AC component of the input signal, generates a voltage corresponding to the level of the bias voltage and the AC signal level, and supplies the voltage to the control terminal of the last-stage transistor.

2. The semiconductor integrated circuit for high frequency power amplifier according to claim 1, wherein the AC component of the input signal is detected by a capacitor element, one terminal of which is connected to a signal line through which signals are carried from the output terminal of the preceding-stage transistor of the power amplifier circuit to the control terminal of the last-stage transistor of the power amplifier circuit, and input to the detection circuit.

3. The semiconductor integrated circuit for high frequency power amplifier according to claim 1, wherein the detection circuit comprises:

a first transistor which receives the AC component of output from a preceding-stage transistor of the power amplifier circuit and a voltage from the bias circuit at a control terminal of the first transistor;

a second transistor connected in series to the first transistor;

a third transistor which forms a current mirror circuit with the second transistor; and a current-voltage conversion means which converts current flowing through the third transistor into a voltage for output.

4. The semiconductor integrated circuit for high frequency power amplifier according to claim 3, wherein the bias circuit includes a transistor whose control terminal and the control terminal of the first transistor are coupled, and a voltage which is outputted from the transistor is supplied to the control terminal of the first transistor for setting an operating point of the detection circuit.

5. A semiconductor integrated circuit for high frequency power amplifier comprising:

a power amplifier circuit including two or more transistors for amplification connected in cascade to amplify a high frequency signal to be transmit; and a nonlinear amplifier circuit which makes flow an operating current in accordance with a predetermined bias voltage and in which output of a preceding-stage transistor of the power amplifier circuit is inputted, wherein the nonlinear amplifier circuit generates a voltage in accordance with a magnitude of the operating current and a magnitude of the output of the preceding-stage transistor and supplies the voltage to the control terminal of the last-stage transistor of the power amplifier circuit.

6. The semiconductor integrated circuit for high frequency power amplifier according to claim 5, further comprising:
 a bias circuit which generates bias voltages to set desired idle currents to flow through the two or more transistors of the power amplifier circuit respectively,
 wherein a bias voltage of one of the bias voltages that is given to allow a desired idle current to flow through the last stage transistor of the power amplifier circuit is applied to the nonlinear amplifier circuit, causing the operating current corresponding to the bias voltage to flow in the nonlinear amplifier circuit.

7. The semiconductor integrated circuit for high frequency power amplifier according to claim 5,
 wherein a signal detected by a capacitor element, one terminal of which is connected to a signal line through which signals are carried from the output terminal of a preceding-stage transistor of the power amplifier circuit to the control terminal of the last-stage transistor is input to the nonlinear amplifier circuit.

8. The semiconductor integrated circuit for high frequency power amplifier according to claim 5,
 wherein the nonlinear amplifier circuit comprises:
 a first transistor which receives an AC signal component output from a preceding-stage transistor the power amplifier circuit and a voltage from a bias circuit at a control terminal of the first transistor;
 a second transistor connected in series to the first transistor;
 a third transistor which forms a current mirror circuit with the second transistor; and
 a current-voltage conversion means which converts current flowing through the third transistor into a voltage for output.

9. The semiconductor integrated circuit for high frequency power amplifier according to claim 8,
 wherein the bias circuit includes a transistor whose control terminal and the control terminal of the first transistor are coupled, and a voltage which is outputted from the transistor is supplied to the control terminal of the first transistor for setting an operating point of the nonlinear amplifier circuit.

10. An electronic component for high frequency power amplifier comprising:
 the semiconductor integrated circuit for high frequency power amplifier as recited in claim 1;
 an AC component detection means for detecting the AC component of an output of the power amplifier circuit, arranged on the output line of the power amplifier circuit;
 capacitor elements which cut off the DC component of the output of the power amplifier circuit and is arranged on the output line; and
 an impedance matching circuit arranged on the output line,
 wherein the semiconductor integrated circuit, the AC component extraction means, the capacitor elements, and the impedance matching circuit are installed over a single insulating substrate.

* * * * *